United States Patent
Jaenecke (10) Patent No.: US 7,348,844 B2
(45) Date of Patent: Mar. 25, 2008

(54) ADAPTIVE DIGITAL PRE-DISTORTION SYSTEM

(75) Inventor: Peter Jaenecke, Straubenhardt (DE)

(73) Assignee: Alcatel, Paris (FR)

( * ) Notice: Subject to any disclaimer, the term of this patent is extended or adjusted under 35 U.S.C. 154(b) by 65 days.

(21) Appl. No.: 11/475,886

(22) Filed: Jun. 28, 2006

(65) Prior Publication Data

US 2007/0018722 A1  Jan. 25, 2007

(30) Foreign Application Priority Data

Jul. 21, 2005  (EP)  ................................. 05300608

(51) Int. Cl.
*H03F 1/26*  (2006.01)
(52) U.S. Cl. ....................... 330/149; 375/297
(58) Field of Classification Search ............... 330/149; 375/297; 455/114.3
See application file for complete search history.

(56) References Cited

U.S. PATENT DOCUMENTS

| | | | | |
|---|---|---|---|---|
| 5,886,573 A | * | 3/1999 | Kolanek | 330/10 |
| 6,697,436 B1 | * | 2/2004 | Wright et al. | 375/296 |
| 6,794,936 B2 | * | 9/2004 | Hsu et al. | 330/149 |
| 2003/0042978 A1 | | 3/2003 | Hsu et al. | |
| 2004/0155707 A1 | | 8/2004 | Kim et al. | |

OTHER PUBLICATIONS

Anding Zhu et al: "Adaptive volterra-based predistorter design for RF high power amplifiers." Sep. 2001, pp. 100-105.

* cited by examiner

*Primary Examiner*—Henry Choe
(74) *Attorney, Agent, or Firm*—Sughrue Mion, PLLC (57) ABSTRACT

An adaptive Digital Pre-distortion System and a method for correcting especially power amplifier memory effects. In particular, the invention relates to an electronic circuit, for amplifying an input signal, comprising: a clipping unit for generating a signal, having a reduced peak-to-average power ratio by clipping the input signal; a pre-distorter for generating a pre-distorted signal, defined by an pre-distortion algorithm which is based on the amplifier model function; a representation unit for representing the amplifier model function; a non-linear processing unit, in particular a power amplifier, for generating a processed signal, in particular by amplifying said received pre-distorted signal; a time delay unit for compensating the processing time for the pre-distorted signal generating the delayed pre-distorted signal; and a time delay cascade for delaying the said delayed pre-distorted signal, at the integer sample clocks generating the signals.

6 Claims, 4 Drawing Sheets

ADAPTIVE DIGITAL PRE-DISTORTION SYSTEM

TECHNICAL FIELD

The present invention relates to an adaptive Digital Predistortion System and a method for correcting especially power amplifier memory effects. The invention is based on a priority application, EP 05300608.6, which is hereby incorporated by reference.

BACKGROUND OF THE INVENTION

The invention especially applies to the field of wireless communication systems for transmitting digital multi-carrier signals using, e.g., Orthogonal Code Division Multiplex (OCDM), Orthogonal Frequency Division Multiplex (OFDM), or High Speed Down Link Packet Access (HS-DPA). In particular, the invention relates to systems and methods for linearizing power amplifiers with strong memory effects.

Conversion, modulation, and amplification are non-linear transformations, which can cause the violation of the spectrum emission requirements and/or a low operating efficiency. Linearization methods are used, therefore, in order to weaken this disadvantage. Predistortion is a linearization method which modifies the complex digital source signal x from the transmit path in such a way that $$z = yx$$

where $$y > 0$$

is a real constant, and z is the complex digital amplifier output signal from the feedback path.

There are two different types of non-linearity: (a) Non-linearity in the common sense; it mainly causes the overall curvature which finally passes into the saturation shown in FIG. 4, light curve. (b) Non-linearity as a consequence of memory effects especially produced by the power amplifier; this non-linearity is indicated mainly by a noise-like shape of the AM-AM diagram in FIG. 4, dark curve. A predistortion method is searched for, which can handle both types of non-linearity.

A number of prior art predistorters are restricted to a predistortion based on multiplying the input sample x by a complex gain, see e.g. Linearization method for amplifier and amplifier arrangement, WO 99/57806, Transmitter Linearization, WO 00/36800, Amplifier Linearization by Adaptive Predistortion. U.S. Pat. No. 5,049,832, Kelly Mekechuk; Wan-Jong Kim; Shawn P. Stapleton; Jong Heon Kim: Linearizing Power Amplifiers Using Digital Predistortion, EDA Tools and Test Hardware. *High Frequency Electronics*, April 2004, p. 18-25, or Method for improving the output power of a non-linear power amplifier WO 2004/070943.

Let $$\xi = x \cdot \Gamma(|x|^2)$$

where x is a sample from the input signal to be amplified, $\xi$ is a sample from the predistorted signal, and $\Gamma$ is the complex gain. $\Gamma$ is normally computed in comparing the digital complex input signal x with the digital complex power amplifier output signal z extracted from the feedback path. This approach is a good technique for handling non-linearities of type (a), however, it fails for non-linearities of type (b).

The complex gain approach can be extended to $$\xi = x \cdot \Gamma(|x|^2, |x_{-1}|^2, \ldots, |x_{-k}|^2)$$

with $k \geq 1$, where x is the present input sample, and where $$x_{-i}$$

is the input sample i sample clocks before ($1 \leq i \leq k$). The latter approach allows taking into account the "past" by considering previous samples; however, only the memory effect from the non-linearity (a) can be realized.

There are prior art predistorters e.g. disclosed in WO 2004/095715 or US 2005/0001684 A1 using an additive correction, e.g.

$$\xi = x + C(|x|^2)$$

these predistortion types are quasi equivalent to those based on a complex gain.

Figure 1:
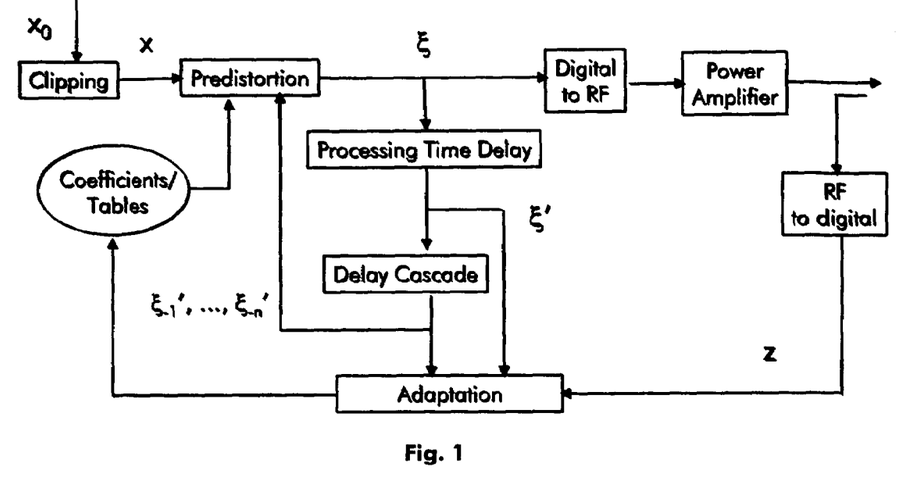
FIG. 1 shows a block diagram of the processing path for the adaptive predistortion used in the present invention.
Figure 2:
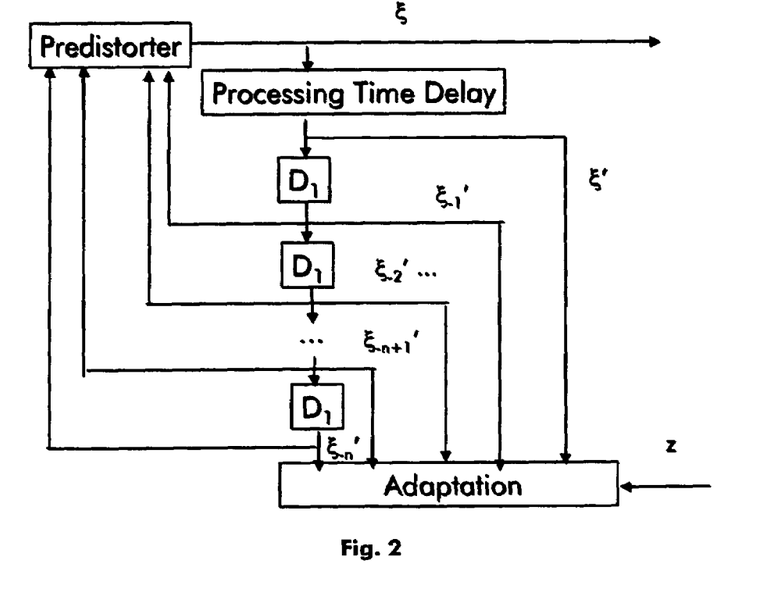
FIG. 2 shows time delay units. Unit $D_1$ delays the signal at 1 sample clock; the processing time delay unit delays the signal just at that time, the signal uses to get from the predistorter to the adaptation unit.
Figure 3:
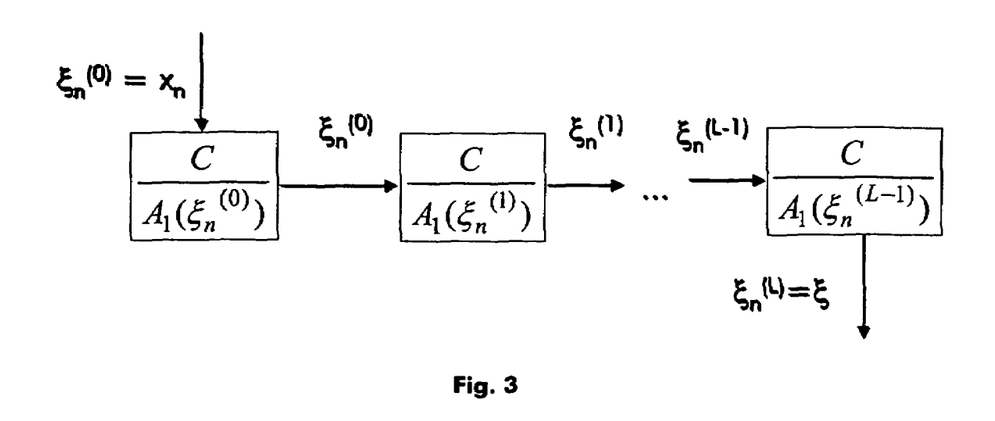
FIG. 3 shows a predistortion unit according to predistortion method of the present invention.

Another type of adaptive predistorter uses a digital filter; see e.g. Method and apparatus for linear transmission by direct inverse modelling, WO 98/51047, where the filter coefficients are learnt in a similar manner as shown in FIG. 1. Filter approaches should have nearly the same performance than VOLTERRA-like approaches.

Volterra series is a general nonlinear power amplifier model; it has been successfully used to derive behavioural models for RF power amplifiers with memory effects, see e.g. Zhu, Anding & Brazil, Thomas J.: Adaptive Volterra-based Predistorter Design for RF High Power Amplifiers. IEEE 2001, 100-105. Mirri, Domenico et al.: A Modified Volterra Series Approach for Nonlinear Dynamic Systems Modelling. IEEE Transactions on Circuits and Systems—I. Fundamental Theory and Applications, 49, No. 8, August 2002, 1118-1128, or Raich, Raviv & Zhou, Tong G.: On the Modelling of Memory nonlinear effects of Power Amplifiers for Communication Applications. IEEE 2002, 7-10.

However, it has serious drawbacks: a large number of coefficients that must be extracted, and the exact inverse of a Volterra system is difficult to construct. The crucial point for such approaches is to find out an appropriate simplification of the VOLTERRA series and its inverse.

There are some suggestions for realizing predistortion with a simplified Volterra-like approach, see e.g. Chang, Sekchin & Powers, Edward: A Simplified Predistorted for Compensation of Nonlinear Distortion in OFDM Systems. IEEE 2001, 3080-3084 or Zhu, Anding & Brazil, Thomas J.: Adaptive Volterra-based Predistorter Design for RF High Power Amplifiers. IEEE 2001, 100-105, but performance seems to be insufficient for wideband CDMA signals. Thus, Zhu, Anding and Brazil, Thomas, Adaptive Volterra-Based Predistorter Design for RF High Power Amplifier, IEEE 2001, pp.100-105, presents simulation results only for an IS-95 CDMA signal.

Predistortion with the VOLTERRA system is usually realized by the complicated pth-order inverse technique, see e.g. Schetzen, M.: The Volterra and Wiener Theories of Nonlinear Systems. New York: Wiley, 1980, which turns out to be only an approximation. Amongst other things, two simplified cases of the Volterra model have been recently proposed to capture the memory effect: (i) A linear time-invariant (LTI) system followed by a memoryless nonlinearity (Clark, C. J. et al., Time Domain Envelope Measurement Technique with Application to Wideband Power Amplifer Modelling, IEEE Trans. Microwave Theory Tech. 46, 1998, pp. 2534-2540). Advantage of this so-called 'Wiener modelling': the corresponding predistorter is a Hammerstein system consisting of a memoryless nonlinearity followed by an LTI system, so that it is possible for the predistorter to be an exact inverse of the power amplifier model. (ii) A memory polynomial model according to $$\xi_n = \sum_{j=1}^{J} \sum_{k=0}^{K} a_{jk} x_{n-k} \cdot |x_{n-k}|^{j-1}$$

Similar to the Volterra model, an exact inverse of the memory polynomial is difficult to obtain; Ding et al. propose, therefore, another memory polynomial as an approximate inverse, see Ding, Lei; Zhou, G. Tong; Morgan, Denis R., Ma, Zhengxiang; Kenney, J. Stevenson; Kim, Jaehyeong; Giardina, Charles, R.: A Robust Baseband Predistorter Constructed using Memory Polynomials. IEEE Transactions on Communications 52, No. 1, 2004, 159-165. They argue that it is difficult to judge which power amplifier model is the best, since it could depend on the amplifier type, the data format being transmitted etc. Moreover, they argue that the most accurate power amplifier model may not be the most amenable to predistortion. They suggest, therefore, taking the linearization as the ultimate objective.

Adaptive digital predistortion: (i) Find a good model for the power amplifier model by unifying both, the latter approach with the memory polynomial approach. (ii) Learn this model by combining both aspects: to get the most accurate power amplifier characteristic, and to get the optimum linearization. (iii) Reduce the computational efforts by using a simple recursion formula for calculating the predistorted samples.

SUMMARY OF THE INVENTION

This problem of improving predistortion is solved by an electronic circuit, in particular of a wireless communication system, for amplifying an input signal, $x_0$, comprising: a clipping unit for generating a signal, $x_o$, having a reduced peak-to-average power ratio by clipping the input signal, a pre-distorter for generating a pre-distorted signal, $\xi$, defined by an pre-distortion algorithm which is based on the amplifier model function A; a representation unit for representing the amplifier model function, A, either in terms of coefficients of polynomials, or as look-up tables; a non-linear processing unit, in particular a power amplifier, for generating a processed signal, z, in particular by amplifying said received pre-distorted signal, $\xi$; a time delay unit for compensating the processing time for the pre-distorted signal $\xi$ generating the delayed pre-distorted signal $\xi'$; and a time delay cascade for delaying the said delayed pre-distorted signal, $\xi'$, at the integer sample clocks $1, 2, \ldots, n$ generating the signals $$\xi_{-1}', \xi_{-2}', \ldots, \xi_{-n}'$$

as well as an adaptation unit for learning the amplifier model function A using the amplified signal, z, and the delayed signals $$\xi, \xi_{-1}', \xi_{-2}', \ldots, \xi_{-n}'$$

The problem is solved inter alia by a method for predistortion with such an electronic circuit where the complex digital amplifier output signal from the feedback, path can be described as a function $$A(\xi_n, \xi_{n-1}, \xi_{n-2}, \ldots, \xi_{n-K}) = A_1(\xi_n) \cdot A_2(\xi_{n-1}) \ldots A_{K_1}(\xi_{n-K_1}) +$$
$$B_1(\xi_{n-1})\xi_{n-1} + B_2(\xi_{n-2})\xi_{n-2} + \ldots + B_{K_2}(\xi_{n-K_2})\xi_{n-K_2},$$

having a multiplicative and additive terms, where $K = \max(K_1, K_2)$, $K_1 = 0, 1, \ldots$, $K_2 = 1, 2, \ldots$ The advantages of the present invention are a cost reduction and higher efficiency. As long as the saturation point is not reached, the performance of the predistortion is nearly independent on the amplifier output power, i.e., the amplifier can be driven near the operating limits. The performance of the predistortion is scarcely influenced by the amount of the amplifier memory effect, and by the common non-linearity in the range below the saturation point, i.e. in building an amplifier, the focus is not any longer to reach a best possible linearity, rather to reach an output power as high as possible—at the cost of non-linearities, because they now can be disposed to a large extent by predistortion.

BRIEF DESCRIPTION OF THE DRAWINGS

The invention is described in the following using the figures, where.

DETAILED DESCRIPTION OF THE INVENTION

It is known that in case of memory effects the amplifier characteristic A depends on samples from the past; it holds $$A(\xi_n, \xi_{n-1}, \xi_{n-2}, \ldots, \xi_{n-K}) = y_n / x_n$$

where $\xi_{n-k}$, $k=0,1,2, \ldots$ is the predistorted signal at time n–k, and $z_n$ is digital complex power amplifier output from the feedback path. In the present invention it is assumed that the amplifier characteristic A can be split into a multiplicative and additive term according to $$A(\xi_n, \xi_{n-1}, \xi_{n-2}, \ldots, \xi_{n-K}) = A_1(\xi_n) \cdot A_2(\xi_{n-1}) \ldots A_{K_1}(\xi_{n-K_1}) +$$
$$B_1(\xi_{n-1})\xi_{n-1} + B_2(\xi_{n-2})\xi_{n-2} + \ldots + B_{K_2}(\xi_{n-K_2})\xi_{n-K_2},$$

where $K=\max(K_1,K_2)$, $K_1=0,1,\ldots$, $K_2=1,2,\ldots$

Predistortion means: Find the predistorted sample $\xi_n$ for the given input sample $x_n$ in such a way that $A(\xi_n,\xi_{n-1},\xi_{n-2},\ldots,\xi_{n-K})=y_{fb}x_n$ where $y_{fb}$ is a constant feedback gain with $0<y_{fb}\leq 1$ Inserting the predistortion condition into the equation yields to $$A_1(\xi_n)\cdot A_2(\xi_{n-1})\ldots A_{K_1+1}(\xi_{n-K_1}) = \gamma_{fb}x_n - \sum_{k_2=1}^{K_2} B_{k_2}(\xi_{n-k_2})\xi_{n-k_2}$$

Since the functions $A_1,A_2,\ldots,A_{K_1}$ form the multiplicative term must not be zero, the above equation can be divided;

$$\xi_n = \frac{\gamma_{fb} - \sum_{k_2=1}^{K_2} B_{k_2}(\xi_{n-k_2})\xi_{n-k_2}}{A_1(\xi_n)\cdot \prod_{k_1=1}^{K_1} A_{k_1+1}(\xi_{n-k_1})}$$

The term $$C(x_n;\xi_{n-1},\xi_{n-2},\ldots,\xi_{n-k}) = \frac{\gamma_{fb}x_n - \sum_{k_2=1}^{K_2} B_{k_2}(\xi_{n-k_2})\xi_{n-k_2}}{\prod_{k_1=1}^{K_1} A_{k_1+1}(\xi_{n-k_1})}$$

is a constant for given since it only depends on $x_n$ itself and the predistorted samples $\xi_{n-1},\xi_{n-2},\ldots,\xi_{n-K}$ which are factors occurred in the past, i.e., they can not be varied any longer. To determine the predistorted sample $\xi_n$ the constant $C=C(x_n;\xi_{n-1},\xi_{n-2},\ldots,\xi_{n-k})$ has to be calculated and thereafter the equation $$\xi_n = \frac{C}{A_1(\xi_n)}$$

has to be solved. This can be done, e.g., recursively according to the recursion equation $$\xi_n^{(r)} = \frac{C}{A_1(\xi_n^{(r-1)})},$$

$r = 1,2,\ldots;$ $\xi_n^{(0)} = x_n$

Adaptation means to learn the functions $A_1,A_2,\ldots$ which can be represented either by look-up tables or by parameters of a known function type, e.g. by coefficients of polynomials. We assume that the functions $A_1,A_2,\ldots$ are described by the variables $b=(\beta_1,\beta_2,\ldots)$ where the $\beta$ s can be both values from a look-up table and function parameters. The base of the adaptation procedure is $A(\xi_n,\xi_{n-1}\xi_{n-2},\ldots)=z_n$ where $\Xi=(\xi_1,\xi_2,\ldots)$ and $Z=(z_1,z_2,\ldots)$ are known signals. The learning starts with a set of initial values $b_0$ For run $k\geq 0$ there is the following situation:
The power amplifier has transformed $\xi_n$ into $z_n$

;

$b_k$ and $\xi_n,\xi_{n-1},\ldots$ yield $A(\xi_n,\ldots;b_k)$

; the error in describing the characteristic is $$A(\xi_n, \ldots ;b_k)-z_n=E_k$$

;

from equation $$A(\xi_n,\xi_{n-1},\xi_{n-2}, \ldots ,\xi_{n-K})=y_{fb}x_n$$

follows that $$L_n=A(\xi_n, \ldots ;b_k)-y_{fb}x_n$$

is the measure for the actual non-linearity.

It follows the learning criterion is: Find a parameter set b for which $$E_n \to 0$$

and $$L_n=0.$$

As an preferred embodiment one could follow the approach $$A(\xi_n, \xi_{n-1}, \xi_{n-3}, \ldots , \xi_{n-9}) = A_1(\xi_n) \cdot A_2(\xi_{n-1}) + \sum_{k=1}^{4} \xi_{n-2k+1} \cdot B_k(\xi_{n-2k+1})$$

$$C(x_n; \xi_{n-1}, \xi_{n-3}, \ldots , \xi_{n-9}) = \frac{x_n - \sum_{k=1}^{4} \xi_{n-2k+1} \cdot B_k(\xi_{n-2k+1})}{A_2(\xi_{n-1})}$$

Using polynomials of third degree as described in EP 1 482 637 approximates the functions. The adaptation conditions is to calculate b in such way that both $$|A(\xi_n, \ldots ;b)-z_n|^2$$

and $$|A(\xi_n, \ldots ;b)-y_{fb}x_n|^2$$

are minimal.

Lab measurements of the preferred embodiment are given in the FIG. 4-8.

Figure 4:
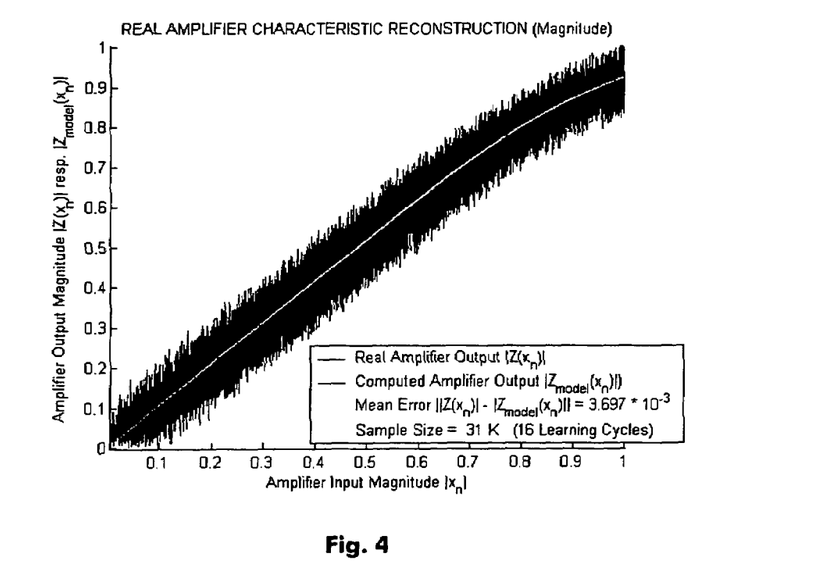
FIG. 4 is an AM-AM diagram (35 W output power).
Figure 5:
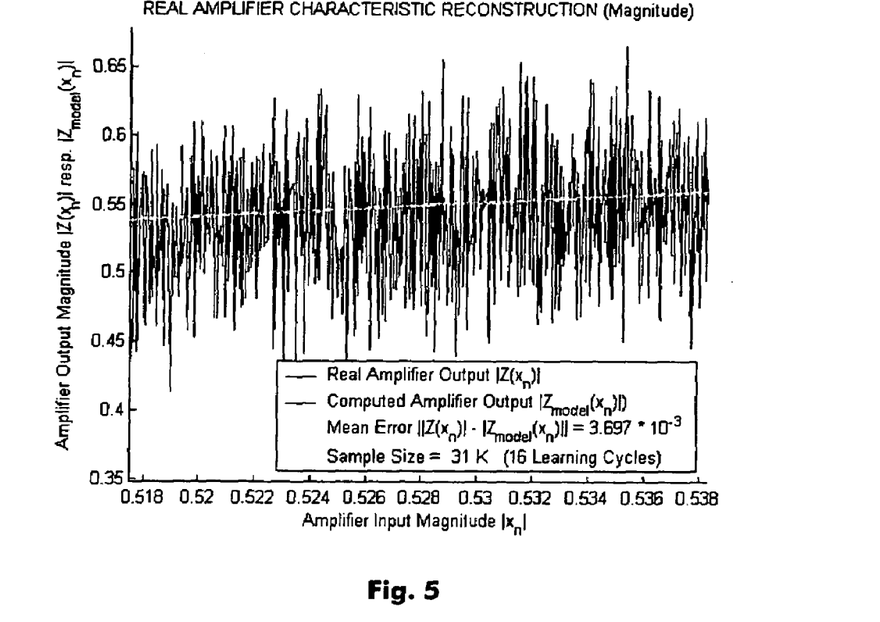
FIG. 5 is a section from FIG. 4.

FIG. 4 and FIG. 5 show the AM-AM diagrams from the original power amplifier output signal and the theoretical output signal calculated with the function A. The diagrams show that there is an acceptable congruence between modelled and real amplifier in the time domain.

Figure 6:
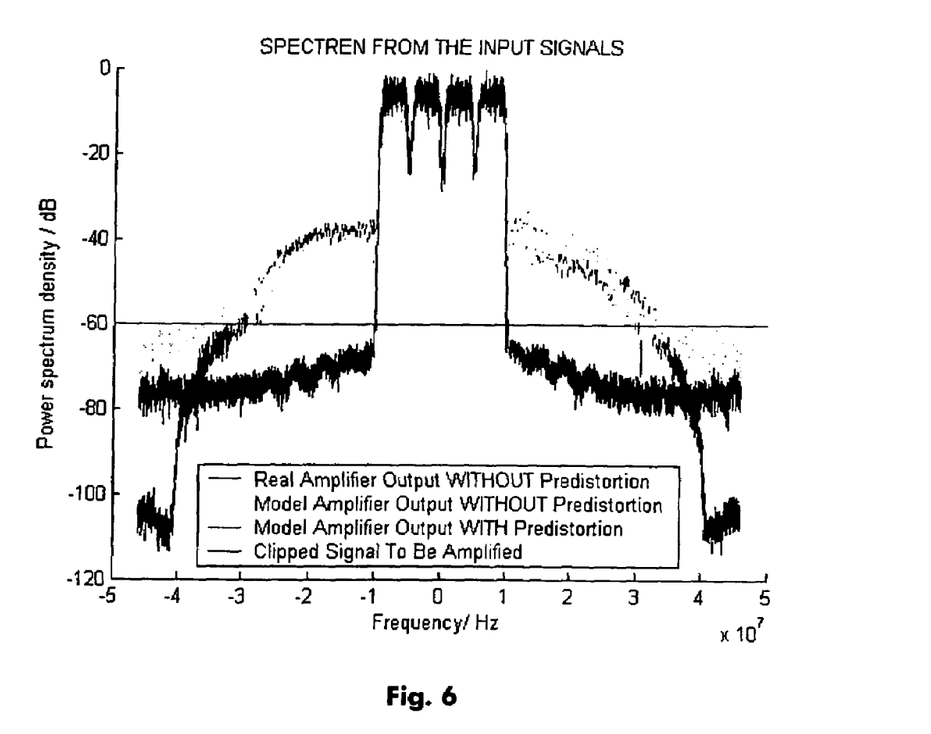
FIG. 6 shows power spectrum densities.

This fact also is shown in FIG. 6 for the frequency domain: Real and modelled amplifier output without predistortion, i.e. the signal with the higher power spectrum density, are in a good agreement (besides half band effects); the spectrum from the original signal and the spectrum from predistorted modelled amplifier output are nearly identically.

Figure 7:
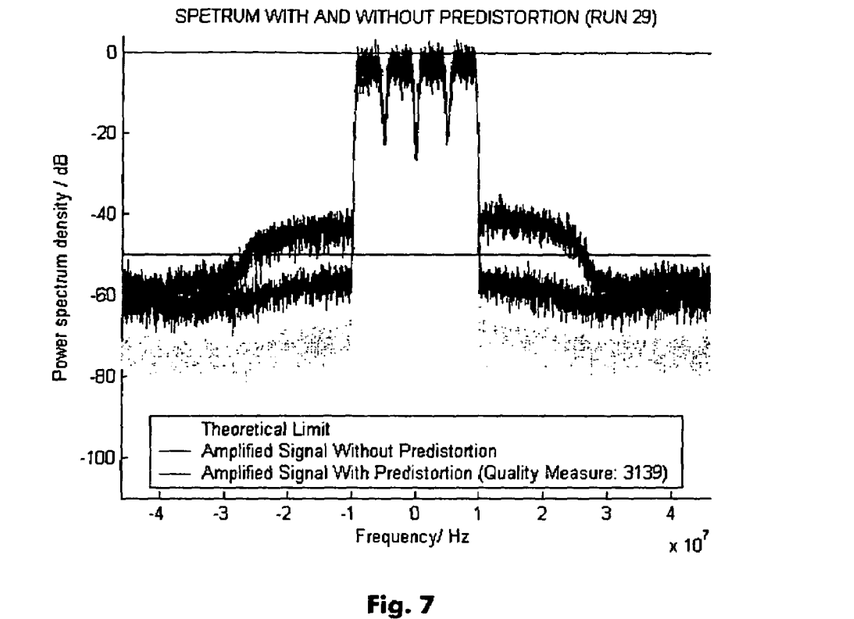
FIG. 7 shows spectrum with and without predistortion (35 W).
Figure 8:
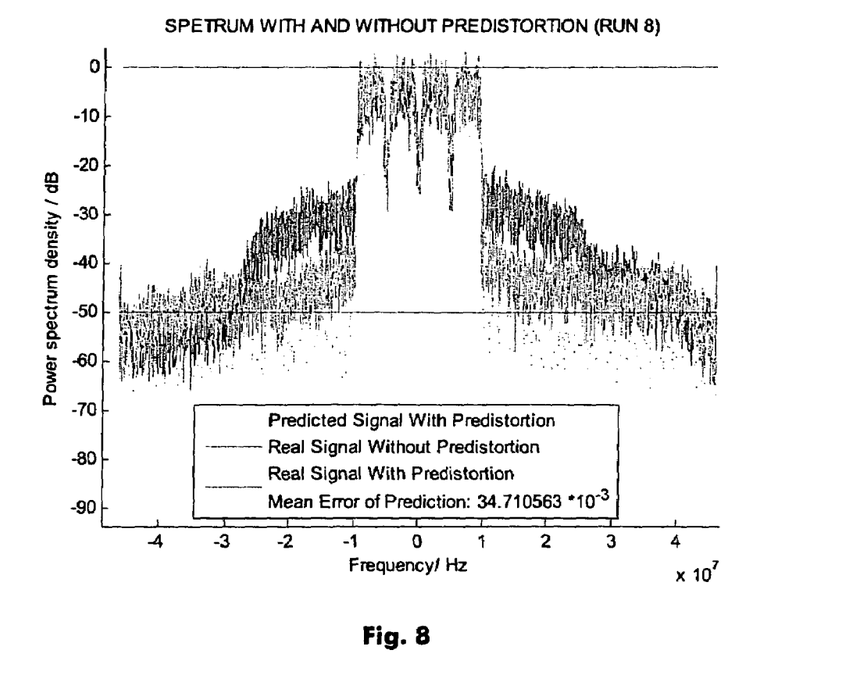
FIG. 8 shows spectrum with and without predistortion (35 W, defect amplifier).

FIG. 7 and FIG. 8 are first predistortion examples. Especially in FIG. 8 the behaviour of the predistortion system was tested in case of a defect amplifier. Here also the spectrum with the higher power density is the signal without predistortion. The example illustrates that also in extremely adversarial conditions the invented predistortion system converges.

The polynomials could be identified by a multi-dimensional gradient method. Predistortion modifies the complex digital source signal x in such a way that $$z=yx$$

where $$y>0$$

is a real feedback constant and z is the complex digital amplifier output signal from the feedback path. Let be $$P(c_1,c_2, \ldots ,c_L;x_n,x_{n-1}, \ldots ,x_{n-K})$$

the predistortion function, where $$c_1,c_2, \ldots ,c_L$$

are the coefficients of the polynomials, and $$x_{n-k}, k=0,1, \ldots ,K$$

is the input sample at time n−k; sample $x_n$ is the sample at the present time. Linearization means, to find a predistortion function P in such a way that $$\xi_n-P(c_1, \ldots ,c_L;x_n, \ldots ,x_{n-k})$$

and $$z_n=A(\xi_n, \ldots ,\xi_{n-K})=yx_n$$

for all samples $$x_1,x_2, \ldots ,x_n,x_{n+1}, \ldots$$

A denotes the amplifier characteristic.

The functional form from P (i.e., the number and degree of its polynomials) defines the amplifier model; assumed to be already known. What remains in determining P is the calculation of appropriate coefficients $$c_1,c_2, \ldots ,c_L$$

It is done by the gradient method $$c_l^{m+1}=c_l^m+\delta_l^m d_l^m(\text{signals})$$

where m+1 is the actual adaptation step, $$c_l^\mu$$

is the coefficient $$c_l$$

for adaptation step μ, $$\delta_l^\mu$$

is the corresponding step size, and $$d_l^m(\text{signals})$$

is the update direction for coefficient l at the adaptation step μ. The update direction follows from the gradient of the squared error function to be minimized; it can be computed from the predistortion function P and from the error model used. The present invention relates to the problem to compute suitable step sizes $$\delta_l^\mu$$

for a multidimensional gradient method.

It is known from the literature that the step size selection is a crucial point for the gradient method because improper step sizes can cause a divergence, i.e., non-convergent oscillations or non-finite solutions. There are some step size selection rules, most commonly used is the ARMIJO rule. All these rules have the disadvantage that they need more or less arbitrary parameters (like tolerance, initial step size, or the amount by which the step size is reduced in every iteration), and that the selection rules are primarily designed for one-dimensional problems; in case of multidimensional problems the step size selection may be computationally expensive. Another disadvantage is that the mathematical methods assume that there exists exactly a unique solution, which has to be determined iteratively, i.e., the iterations are concerned as approximation steps. However, in case of real information processing, the signals are infinite in time and interfered by noise. Furthermore, there are, e.g., thermal effects, which permanently alter the framework, and because each framework has its own solution, the iterations must serve for two antagonistic goals: for the approximation to a solution and for the adaptation to the changing circumstances: If the step sizes were selected too small, then the gradient method can not follow the changing situations; if they were selected too large, a divergence arise. As yet it seems to be no approach, which can handle this problem in an appropriate way.

The update directions of the coefficients vary in a wide range, i.e., they differ in their frequency distribution so that the broader a frequency distribution the higher is the probability for using an incorrect update value. The step size should be coupled at the spread of the update direction: the greater its spread the smaller should be the step size. At first a reference step size is computed according to $$\delta_{ref}^m = \min_{l \in \{1, \ldots, L\}} meas[d_l^m(\text{signals})] \cdot \delta$$

where $$\delta > 0$$

is a constant valid for all coefficients; 'meas' is a measure for the spread of the update direction like variance, standard deviation. The step sizes are defined as $$\delta_l^m = \frac{\delta_{ref}^m}{meas[d_l^m(\text{signals})]}$$

The definition of the step sizes ensure that the step size is $$\delta$$

for all coefficients having the smallest spread value $$\delta_{ref}^m$$

All other coefficients are updated with a step size less than $$\delta$$

This has the advantage that the precondition leads to a stable predistorter system based on a polynomial approach in which the coefficients are updated by an LMS algorithm.

For simplification one could use in the section $$d_m$$

instead of $$d_l^m(\text{signals})$$

since the formula are valid for all coefficients $$l = 1, 2, \ldots, L$$

The preferred spread measures are $$meas = u = \frac{1}{K} \sum_{k=1}^{K} |d_k - \overline{d}|$$

the standard deviation $$meas = s = \sqrt{v}$$

where $$v = \frac{1}{K} \sum_{k=1}^{K} (d_k - \overline{d})^2$$

is the variance, and $$\overline{d} = \frac{1}{K} \sum_{k=1}^{K} d_k$$

is the arithmetical mean. These measures mainly differ with respect to their computational effort.

The formula above are insufficient for signals with a quasi infinite duration. We use, therefore, the relations $$\sigma_m^d = \sigma_{m-1}^d - \overline{d}_{m-1} + d_m$$

$$\overline{d}_m = \frac{1}{K} \sigma_m^d; \quad m = 1, 2, \ldots; \quad K \geq 2$$

for a consecutive calculation of the arithmetic mean with the initial values $$\sigma_0^d = 1, \overline{d}_0 = 0$$

K is—the number of values to be averaged; the index m indicates the m-th calculation of the mean. Accordingly, it follows for measure $$\sigma_m^u = \sigma_{m-1}^u - \overline{u}_{m-1} + u_m$$

$$u_m = |d_m - \overline{d}_m|$$

$$\overline{u}_m = \frac{1}{K} \sigma_m^u; \quad m = 1, 2, \ldots; \quad K \geq 2$$

with the initial values $$\sigma_0^u = 1, u_0 = 0$$

Instead of $$u_m$$

also another measure can be used, e.g., $$v_m = (d_m - \overline{d}_m)^2$$

in case of the variance.

The approach leads to a predistortion system and method for linearizing power amplifiers by calculation of appropriate coefficients of a predistortion function using the gradient method for assessing the step sizes for a gradient method in case of multidimensional optimization problems.

Preferably the step sizes are used as weights for the update directions of the coefficients. A measure could be used depending on the spread of the update directions.

The invention claimed is:

1. An electronic circuit, for amplifying an input signal, $x_0$, comprising:
   a clipping unit for generating a signal, x, having a reduced peak-to-average power ratio by clipping the input signal $x_0'$;
   a pre-distorter for generating a pre-distorted signal, $\xi$, defined by an pre-distortion algorithm which is based on an amplifier model function A;
   a representation unit for representing the amplifier model function, A, either in terms of coefficients of polynomials, or as look-up tables;
   a non-linear processing unit, like a power amplifier, for generating a processed signal, z, like an amplified pre-distorted signal;
   a time delay unit for compensating a processing time for the pre-distorted signal $\xi$ generating a delayed pre-distorted signal $\xi'$;
   a time delay cascade for delaying the pre-distorted signal, $\xi'$, at integer sample clocks 1,2, . . . , n generating delayed signals $\xi_{-1}', \xi_{-2}', \ldots, \xi_{-n}'$ and an adaptation unit for learning the amplifier model function A using the processed signal, z, and the delayed signals $\xi, \xi_{-1}', \xi_{-2}', \ldots, \xi_{-n}'$ such that a measure for non-linearity $L_n$ is minimized.

2. A method for predistortion with an electronic circuit, for amplifying an input signal, $x_0$, comprising:
   a clipping unit for generating a signal, x, having a reduced peak-to-average power ratio by clipping the input signal $x_0'$;
   a pre-distorter for generating a pre-distorted signal, $\xi$, defined by an pre-distortion algorithm which is based on an amplifier model function A;
   a representation unit for representing the amplifier model function, A, either in terms of coefficients of polynomials, or as look-up tables;
   a non-linear processing unit, like a power amplifier, for generating a processed signal, z, like an amplified pre-distorted signal;
   a time delay unit for compensating a processing time for the pre-distorted signal $\xi$ generating a delayed pre-distorted signal $\xi'$;
   a time delay cascade for delaying the pre-distorted signal, $\xi'$, at integer sample clocks 1, 2, . . . , n generating delayed signals $\xi_{-1}', \xi_{-2}', \ldots, \xi_{-n}'$ and an adaptation unit for learning the amplifier model function A using the processed signal, z, and the delayed signals $\xi, \xi_{-1}', \xi_{-2}', \ldots, \xi_{-n}'$ such that a measure for non-linearity $L_n$ is minimized wherein a complex digital amplifier output signal from a feedback, path can be described as a function $$A(\xi_n, \xi_{n-1}, \xi_{n-2}, \ldots, \xi_{n-K}) = A_1(\xi_n) \cdot A_2(\xi_{n-1}) \ldots A_{K_1}(\xi_{n-K_1}) + B_1(\xi_{n-1})\xi_{n-1} + B_2(\xi_{n-2})\xi_{n-2} + \ldots + B_{K_2}(\xi_{n-K_2})\xi_{n-K_2},$$

having a multiplicative and additive terms, where $K = \max(K_1, K_2), K_1 = 0, 1, \ldots, K_2 = 1, 2, \ldots$ 3. The method for predistortion according to claim 2 comprising to learning method for determining adaptively the functions $A_1, A_2, \ldots$ according learning parameter set $b = (\beta_1, \beta_2, \ldots)$, where $\beta_1$ defines the function $A_1, \ldots$ for which an error characteristic $E_n$, i.e. the derivation between real distortion and the model function has the limit $E_n \to 0$ and the measure for the non-linearity $L_n$ has the limit $L_n \to 0$.

4. The method for predistortion according to claim 3, characterized in that for each given clipped sample $x_n$ a constant $C(x_n; \xi_{n-1}, \xi_{n-2}, \ldots, \xi_{n-k})$ is calculated according to equation $$\xi_n = \frac{\gamma_{fb} - \sum_{k_2=1}^{K_2} B_{k_2}(\xi_{n-k_2})\xi_{n-k_2}}{A_1(\xi_n) \cdot \prod_{k_1=1}^{K_1} A_{k_1+1}(\xi_{n-k_1})}$$

, where $y_{fb}$ is a constant feedback gain.

5. Method for predistortion according to claim 3 characterized in that for each given clipped sample $x_n$ a predistorted sample $\xi_n$ is calculated iteratively according to equation $$\xi_n^{(r)} = \frac{C(C_n; \xi_{n-1}, \ldots, \xi_{n-k})}{A_1(\xi_n^{(r-1)})}, \quad r = 1, 2, \ldots \; ; \; \xi_n^{(0)} = x_n$$

6. A wireless communication system comprising a power amplifier, characterized by further comprising an electronic circuit, for amplifying an input signal, $x_0$, comprising:
   a clipping unit for generating a signal, x, having a reduced peak-to-average power ratio by clipping the input signal $x_0'$;
   a pre-distorter for generating a pre-distorted signal, $\xi$, defined by an pre-distortion algorithm which is based on an amplifier model function A;
   a representation unit for representing the amplifier model function, A, either in terms of coefficients of polynomials, or as look-up tables;

a non-linear processing unit, like a power amplifier, for generating a processed signal, z, like an amplified pre-distorted signal;

a time delay unit for compensating a processing time for the pre-distorted signal ξ generating a delayed pre-distorted signal ξ';

a time delay cascade for delaying the pre-distorted signal, ξ', at integer sample clocks 1, 2, . . . , n generating delayed signals $\xi_{-1}', \xi_{-2}', \ldots, \xi_{-n}'$ and an adaptation unit for learning the amplifier model function A using the processed signal, z, and the delayed signals $\xi, \xi_{-1}', \xi_{-2}', \ldots, \xi_{-n}'$ such that a measure for non-linearity $L_n$ is minimized.

* * * * *